(12) United States Patent
Holmes et al.

(10) Patent No.: US 6,344,743 B1
(45) Date of Patent: Feb. 5, 2002

(54) STANDING WAVE MAGNETOMETER

(75) Inventors: John J. Holmes; John F. Scarzello, both of Columbia, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/262,932

(22) Filed: Mar. 5, 1999

Related U.S. Application Data

(60) Provisional application No. 60/123,176, filed on Mar. 5, 1999.

(51) Int. Cl.[7] ...................... G01R 33/02; G01R 33/032; G01R 33/04; G01R 33/09
(52) U.S. Cl. .................... 324/250; 324/244.1; 324/252; 324/253
(58) Field of Search ......................... 324/244, 248–250, 324/252, 253, 254, 258, 260, 534, 639, 645

(56) References Cited

U.S. PATENT DOCUMENTS

| | | | | | |
|---|---|---|---|---|---|
| 2,597,149 A | * | 5/1952 | Kahan | ......................... | 324/250 |
| 2,844,789 A | * | 7/1958 | Allen | ......................... | 324/250 |
| 2,972,105 A | * | 2/1961 | Ghose | ......................... | 324/250 |
| 3,981,181 A | * | 9/1976 | Ochiai | ..................... | 324/534 X |
| 4,906,607 A | * | 3/1990 | Dev Tyagi | .............. | 324/250 X |
| 4,922,180 A | * | 5/1990 | Saffer et al. | ................. | 324/639 |
| 5,065,096 A | * | 11/1991 | Mück et al. | ................. | 324/248 |
| 5,365,391 A | * | 11/1994 | Sugiyama et al. | ...... | 324/260 X |

\* cited by examiner

Primary Examiner—Gerard R. Strecker
(74) Attorney, Agent, or Firm—Howard Kaiser

(57) ABSTRACT

The invention uniquely avails of Fourier analytical principles for determining the distribution of a magnetic field in a one-dimensional (linear), two-dimensional (planar) or three-dimensional (spatial) region of interest. According to many embodiments, integrating sensor apparatus having an associated length is inventively implemented so as to measure the magnetic field amplitude value for each of two or more different points. Alternating current is applied at at least one high frequency whereby, for each such frequency, the associated wavelength corresponds to some multiple of the sensor's length. Coiled around the sensor is/are one or more solenoids which is/are configured so as to establish a standing wave along the sensor's length. Inventive adaptation of the sensor's integrating function basically entails regarding a Fourier-type harmonic bias function as being consequential of the standing wave. A Fourier coefficient is thus inventively found for each selected multiple of the sensor's length. The invention is especially advantageous because a single inventive sensor is capable of measuring a magnetic field distribution of virtually unlimited expanse, the extensiveness of which would conventionally require a multiplicity of arrayed sensors.

21 Claims, 4 Drawing Sheets

STANDING WAVE MAGNETOMETER

CROSS-REFERENCE TO RELATED APPLICATIONS

This application is related to provisional application No. 60/123,176, filed Mar. 5, 1999, hereby incorporated herein by reference, entitled "Integrating Fluxgate Magnetometer and Spatially Integrating Magnetometer," joint inventors John F. Scarzello, John J. Holmes and Edward C. O'Keefe. This application is also related to nonprovisional application Ser. No. 09/517,558, now U.S. Pat. No. 6,278,272, Ser. Nos. 09/517,559 and 09/517,560, each filed Mar. 2, 2000 and claiming the benefit of provisional application no. 60/123, 176.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to methods, systems and apparatuses for measuring a magnetic field, more particular to such methods, systems and apparatuses for measuring the distribution of magnetic field over, through or along an extended distance, area or volume in space.

There are different types of conventional sensors, based on various principles of physics, which measure the magnetic field at a specific point in space. One type of conventional sensor (commonly known as a "fluxgate magnetometer") takes advantage of the magnetic properties of ferromagnetic cores. Another type of conventional sensor takes advantage of magneto-resistive properties of materials.

These and possibly other types of conventional sensors not only are more typically utilized to measure a magnetic field at a specific point in space, but can also be configured to integrate the magnetic field along an extended distance in space. However, in order to measure the distribution of magnetization and/or magnetic field intensity over a spatial distance, area or volume, several conventional sensors must be distributed throughout the space of interest. Therefore, many sensing elements and their individual electronics are conventionally required. Such approaches involving sensor array(s) are disadvantageous in terms of efficiency, cost and reliability.

The fiber optic sensor (also abbreviatedly referred to as the "optic sensor") does not measure the magnetic field at a point; rather, this type of conventional sensor measures the average magnetic field over the length of the optic sensor. The optic sensor takes advantage of certain optical properties of glass fibers to detect and quantify the magnetic field over a limited distance, namely, the length associated therewith.

Still, as regards fiber optic sensing, in order to integrate the magnetic field along an extended distance in space (i.e., measure the distribution of magnetization and/or magnetic field intensity over a spatial distance, area or volume), the conventional approach remains sensor arrayal, according to which a plurality of optic sensors are arranged within the space of interest.

Pertinent background information is provided by the following papers, each of which is hereby incorporated herein by reference:

Lenz, J. E., "A Review of Magnetic Sensors," *IEEE Proceedings*, Vol. 78, No. 6, Jun. 1990; Gordon, D. I., R. E. Brown and J. F. Haben, "Methods for Measuring the Magnetic Field," *IEEE Trans. Mag.*, Vol. Mag-8, No. 1, March 1972; Gordon, D. I. and R. E. Brown, "Recent Advances in Fluxgate Magnetometry," *IEEE Trans. Mag.*, Vol. Mag-8, No. 1, March 1972.

SUMMARY OF THE INVENTION

In view of the foregoing, it is an object of the present invention to provide method, apparatus and system for measuring magnetic field distribution in a sector of interest—e.g., a distance, an area or a volume—which includes a plurality of different spatial points (e.g., distinct, discrete or noncoincident locations in space).

It is another object of the present invention to provide such method, apparatus and system which are more efficient than conventional methods, apparatuses and systems.

It is a further object of this invention to provide such method, apparatus and system which are more economical than conventional methods, apparatuses and systems.

It is another object of this invention to provide such method, apparatus and system which are more reliable than conventional methods, apparatuses and systems.

In accordance with many embodiments of the present invention, a system is provided for determining the distribution of a magnetic field in a spatial sector. The inventive system comprises: means for measuring a magnetic field amplitude value at each of a plurality of points in the sector, wherein the means for measuring is characterized by a length which is defined by the points; means for applying alternating current at a high frequency having an associated wavelength which corresponds to a multiple of the length; means for conducting the applied alternating current so as to establish a standing wave along the length; and, means for processing the measured magnetic field amplitude values, the means for processing including means for performing, over the multiple of the length, Fourier analysis based on a harmonic bias function which results from the standing wave.

According to many inventive embodiments, a method is provided for determining the distribution of a magnetic field in a spatial sector. The inventive method comprises: measuring a magnetic field amplitude value at each of a plurality of points in the sector, wherein the measuring is characterized by a length which is defined by the points; applying alternating current at a high frequency having an associated wavelength which corresponds to a multiple of the length; conducting the applied alternating current so as to establish a standing wave along the length; and, processing the measured magnetic field amplitude values, the processing including performing, over said multiple of said length, Fourier analysis based on a harmonic bias function which results from the standing wave.

According to this invention, a magnetic field amplitude value is determined at one point (location), more typically at each of at least two points (locations). In generally preferred inventive practice, the magnetic field amplitude value can be determined at each of any plural number of points which define the characteristic length of the measuring means. Indeed, such length can be defined by an unlimited (at least two and potentially infinite) number of such points. Moreover, the possible configurations of such points are unlimited in terms of their relative positions and distances. The considered points can be arranged, with respect to each other, in any combination of connectedness (one or more continuities) and/or disconnectedness (one or more discontinuities).

The present invention features the utilization of a sinusoidal standing wave bias field in order to directly measure, in a spatially continuous way, the Fourier coefficients of a distribution of magnetic field. A main advantage of the present invention is that it requires only one set of electronics. In principle, a single inventive sensor can measure the same magnetic field distribution as can a conventional array of sensors having thousands of elements. Moreover, many inventive embodiments can be practiced utilizing various commercially available, off-the-shelf components.

A solenoid is a current-carrying coil (e.g., cylindrical coil), typically of insulated wire, in which an axial magnetic field is established by a flow of electric current. According to a conventional magnetic field sensor, a solenoidal winding is placed around the sensor and powered with a dc current. The solenoidal winding can apply a bias field to the sensor. The purpose of the bias field is to cancel out the earth's magnetic field so as to improve the sensor's linearity over its dynamic range, and to apply a calibration field to the sensing element.

By contrast, the inventive magnetic field sensor uses a bias field which is generated by a radio frequency alternating current source, thereby establishing a standing wave bias. By inventively varying the wavelength of a simple harmonic (e.g., sinusoidal or cosinusoidal) bias field over an integrating sensor, the spatial Fourier Coefficients over the length of the magnetometer can be measured.

According to many conventional control systems, the spatial Fourier coefficients of the distribution of magnetic field are required measured quantities. The Fourier coefficients can be obtained by numerically computing them with magnetic field measurements at discrete locations using an array of conventional sensors. Each of the sensor elements in the array requires its own electronics and data acquisition channel. If the array is large or if the application requires high harmonic content, then the measurement array could be quite costly and may have problems with reliability.

By contrast, the inventive "standing wave magnetometer" can directly measure the spatial Fourier coefficients up to very high harmonic values with only one set of electronics and one data acquisition channel. In addition, the measurement is continuous over the length of the invention's extended integrating sensing element, which avoids spatial sampling issues encountered by a conventional array of sensors that measure the magnetic field at discrete locations in space.

According to conventional methodologies, applications wherein the distribution of a magnetic field is the desired measurement could require a very large array of discrete sensors. This very large array would depend upon the spatial extent of the array or on the required fidelity of the system.

By contrast, according to the present invention, the inventive standing wave magnetometer measures the spatial Fourier coefficients. According to many inventive embodiments, the magnetic field along the associated length which includes the considered spatial points can then be mathematically computed using the inverse Fourier sine (or cosine) series (or transform). According to some inventive embodiments, the Fourier coefficients themselves (which can be obtained directly by practicing the present invention) are the desired measurement parameter.

The inventive magnetometric methodology thus determines the distribution of a magnetic field by using only one electronic package and one data acquisition system. If a conventional array is large or if an application requires high spatial fidelity, then the inventive standing wave magnetometer could significantly reduce the cost of the system and increase its reliability.

The present invention is potentially useful for a variety of applications, both military and commercial. The invention could be used inboard U.S. Naval vessels in association with an "Advanced Closed-Loop Degaussing System."

In addition, the invention could be implemented in association with an underwater-based (e.g., as part of an underwater submarine barrier array, in naval mines, etc.) or land-based intruder-detection system.

Furthermore, the invention has commercial applicability in different geological and geophysical contexts (e.g, in geophysical prospecting for minerals, in geophysical studies, etc.).

Another potential commercial application of the present invention is in the realm of traffic control (e.g., multi-lane vehicle detection).

Other objects, advantages and features of this invention will become apparent from the following detailed description of the invention when considered in conjunction with the accompanying drawings.

BRIEF DESCRIPTION OF THE DRAWINGS

In order that the present invention may be clearly understood, it will now be described by way of example, with reference to the accompanying drawings, wherein like numbers indicate the same or similar components, and wherein.

DETAILED DESCRIPTION OF THE INVENTION

Figure 1:
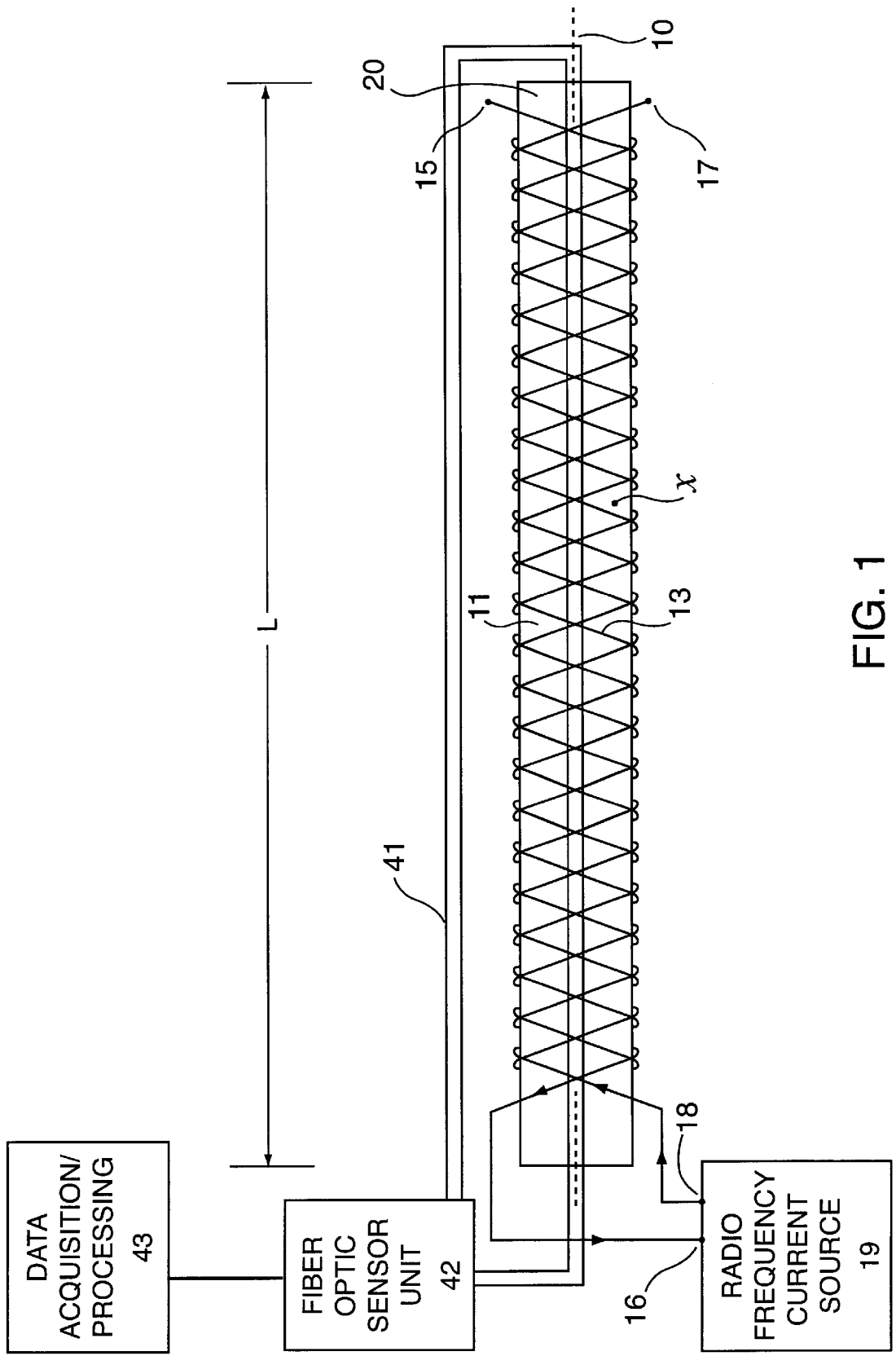
FIG. 1 is a diagrammatic representation of some embodiments of a standing wave magnetometer in accordance with the present invention, particularly illustrating the production of a standing wave bias field using a doubly coiled solenoid configuration.

Referring now to FIG. 1, two bias solenoids 11 and 13 are wound in opposite directions so that their respective ends 15 and 17 are left open. Bias solenoids 11 and 13 are described herein as being "oppositely wound" in the sense that they are oppositely but approximately equally inclined with respect to the imaginary axis 10 of integrating sensing element 20; that is, one solendoid is positively sloped, the other solenoid is negatively sloped, wherein both slopes have approximately equal absolute values. Each solenoid includes insulated wire. The objective of the solenoid windings is to produce a standing wave bias field which has a sinusoidal pattern along the length of the sensor.

Bias solenoids 11 and 13 are driven with radio frequency (RF) current source 19, thereby producing a standing wave bias field along the length of integrating sensing element 20. Ends 15 and 17 of bias solenoids 11 and 13, respectively, must be left open in order to form an impedance discontinuity so as to reflect the RF signal and form the standing wave with a sinusoidal pattern. Ends 16 and 18 of bias solenoids 11 and 13, respectively, are connected to radio frequency current source 19.

Figure 2:
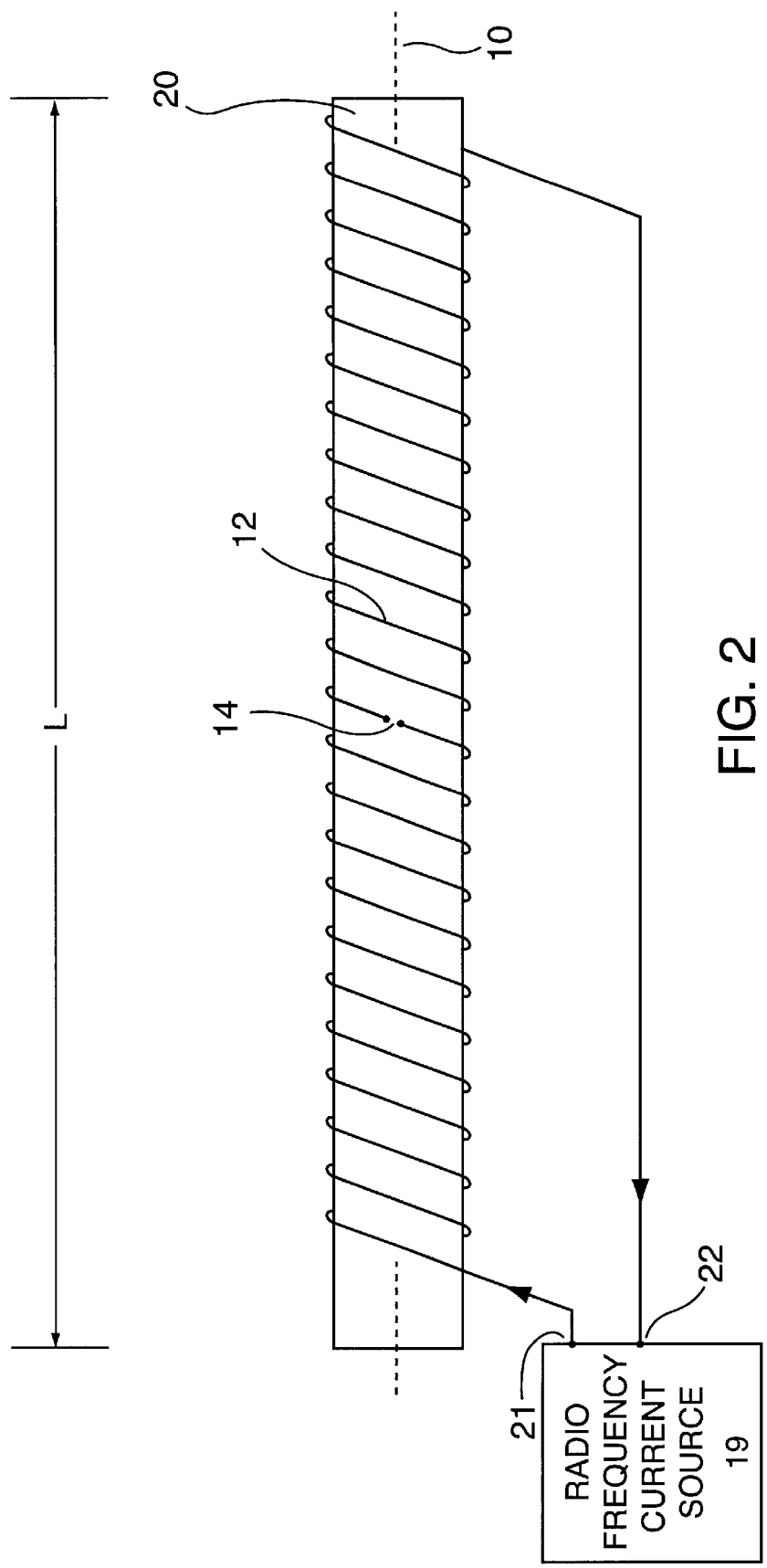
FIG. 2 is a diagrammatic representation of some embodiments of a standing wave magnetometer in accordance with the present invention, particularly illustrating the production of a standing wave bias field using a singly coiled solenoid configuration.

With reference to FIG. 2, one bias solenoid 12 is wound so as to have intermediate discontinuity 14. As shown in FIG. 2, one field bias solenoid 12 winding is used with discontinuity 14 in its approximate center, thereby reflecting the RF and energy and forming a standing wave with a cosinusoidal pattern. Ends 21 and 22 of bias solenoid 12 are each connected to radio frequency current source 19.

In the light of this disclosure, the ordinarily skilled artisan will appreciate that there are numerous methods and techniques for producing a standing wave bias field along the length of an integrating magnetometer, any of which can be suitably effectuated for purposes of practicing the present invention.

Figure 3:
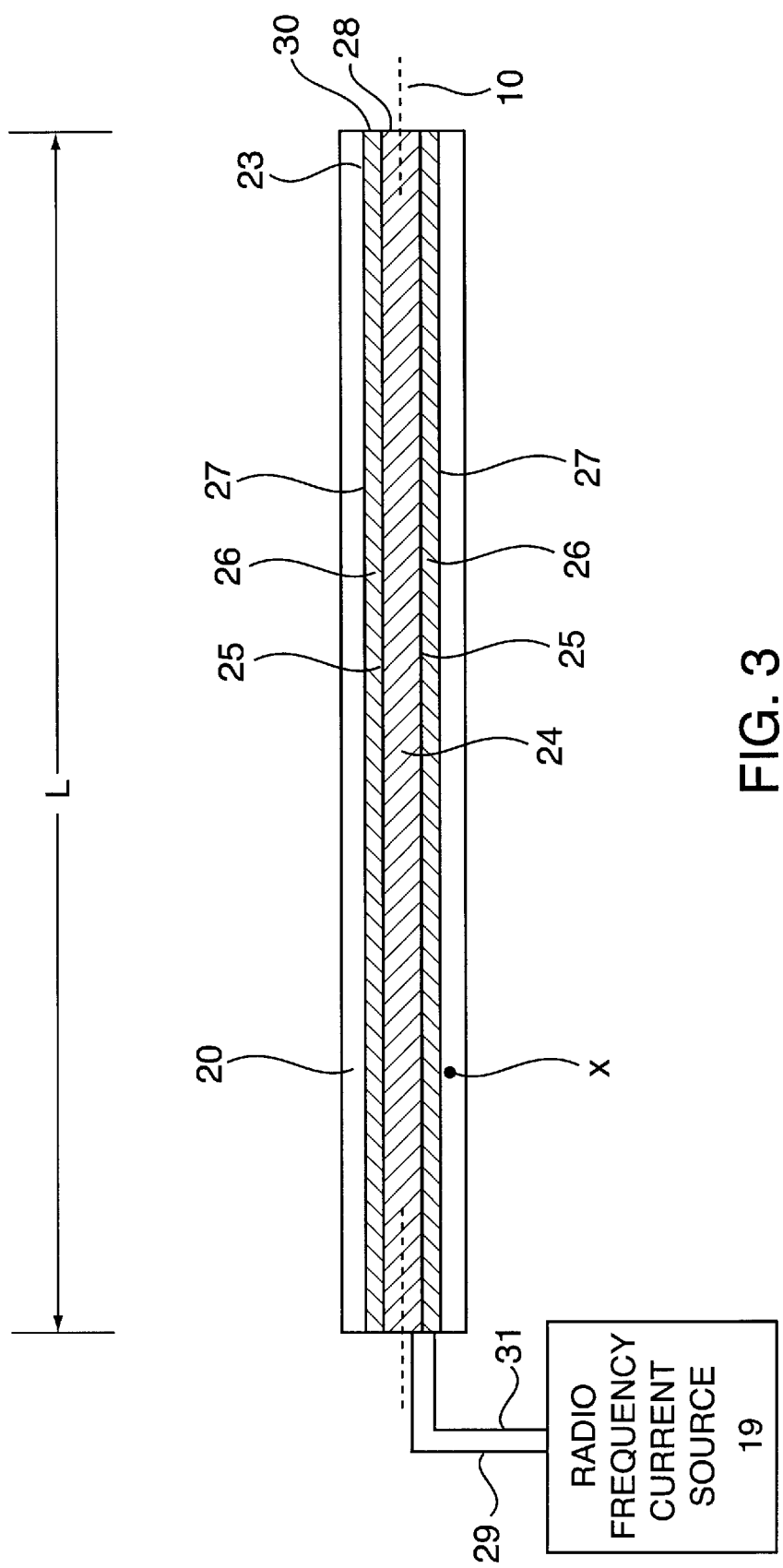
FIG. 3 is a diagrammatic cutaway representation of some embodiments of a standing wave magnetometer in accordance with the present invention, particularly illustrating the production of a standing wave bias field using a coaxial cable.
Figure 4:
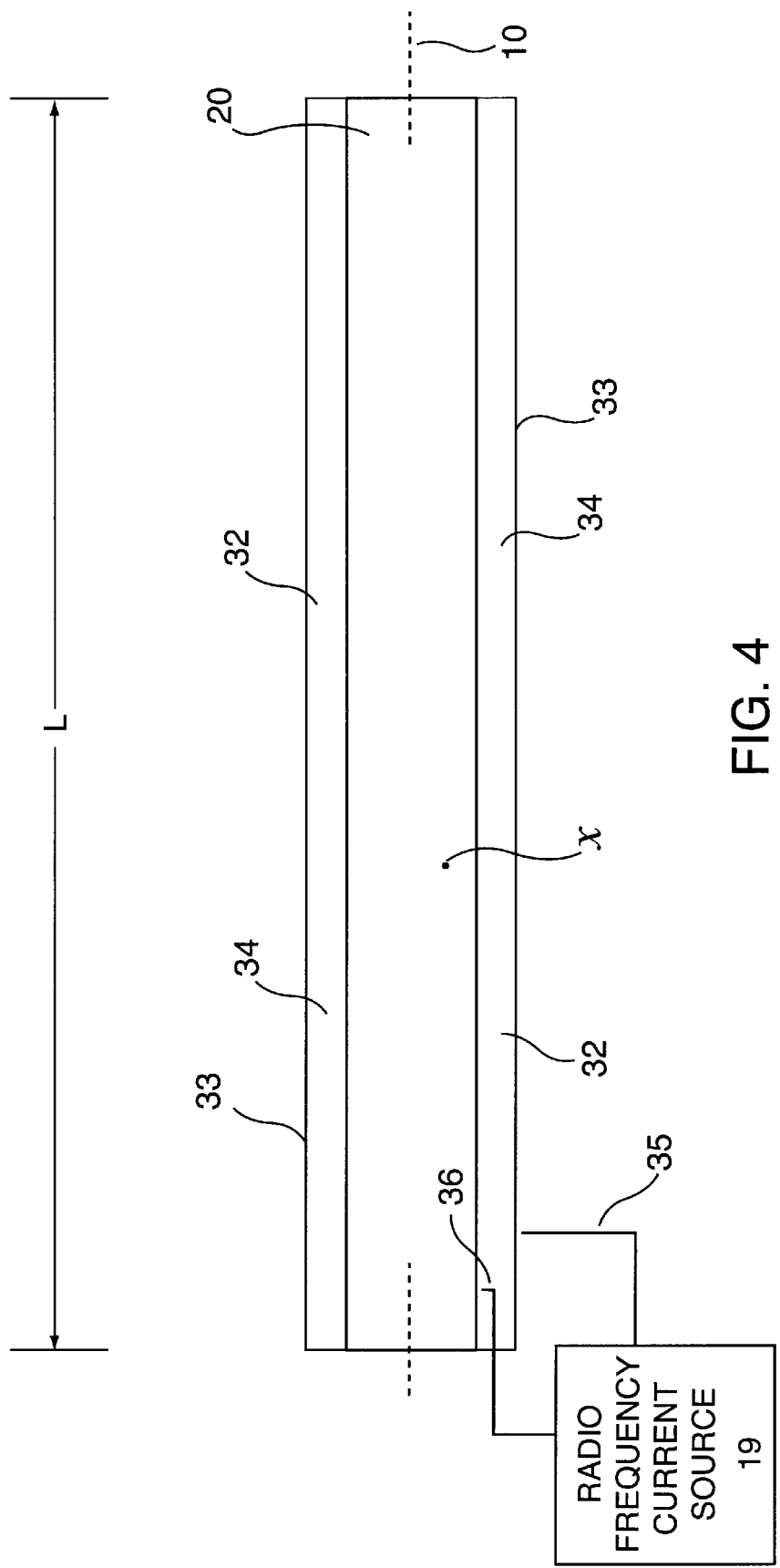
FIG. 4 is a diagrammatic cutaway representation of some embodiments of a standing wave magnetometer in accordance with the present invention, particularly illustrating the production of a standing wave bias field using a waveguide.

Two such methods/techniques for producing a simple harmonic (e.g., sinusoidal or cosinusoidal) bias field along the length of a magnetic field integrating sensing element are shown in FIG. 1 and FIG. 2; these methods/techniques similarly involve solenoid winding. Two distinguishable methods/techniques, discussed hereinbelow, are shown in FIG. 3 and FIG. 4. The present invention admits of effective practice so long as a standing wave bias field is appropriately produced, regardless of the method or technique for producing such standing wave bias field.

According to conventional methodology, direct current is typically used to produce a dc magnetic field bias on the sensing unit, in order to: (i) improve the accuracy of the sensing element; (ii) calibrate the sensing element; or, (iii) offset the value of the earth's magnetic field or another interfering source.

By contrast, the present invention provides for application of a high frequency alternating current to the bias winding for the purpose of establishing a standing wave along the length of the sensing element. In so doing, a sine or cosine bias function can be imparted to the integrating effect of the extended sensing element. By adjusting the drive frequency of the bias current to sequentially step through frequencies whose wavelengths are multiples of the length of the sensing element, the spatial Fourier coefficients can be directly measured. The mathematics of this inventive process is discussed hereinbelow.

When there is no bias field on the extended integrating sensing element, the magnetometer simply measures the integral or average of the magnetic field over its length. Mathematically this process can be represented as $$a_0 = \frac{1}{L}\int_0^L H_t(x)dx \qquad (1)$$

where $a_0$ is the dc term in a Fourier series or transform, $H_t(x)$ is the magnetic field at the point x inside the sensing element, and L is the length of the sensing element. For instance, in each of FIG. 1 through FIG. 4, integrating sensing element 20 is shown to have a length L, and an exemplary point x is shown to be located within integrating sensing element 20.

Fourier analysis is a well known mathematical approximating technique according to which periodic and discontinuous functions may be represented in terms of continuous functions. Fourier analysis generally involves the representation of a function in a Fourier series (expansion) or a Fourier transform. Typically, a function is approximated through the application of a Fourier series to periodic data.

If a sine wave bias field is applied to the length L of the sensing element, then Equation (1) becomes $$a_1 = \frac{1}{L}\int_0^L H_t(x)\sin(x)dx \qquad (2)$$

where $a_1$ is the first (1st) harmonic Fourier coefficient. It should be noted that the drive frequency of the RF current source should be adjusted so that its wavelength equals the length L of the sensing element. Under these conditions the correct sin(x) bias field is obtained.

If the drive frequency is now doubled, Equation (2) becomes $$a_2 = \frac{1}{L}\int_0^L H_t(x)\sin(2x)dx \qquad (3)$$

where $a_2$ is the second (2nd) harmonic Fourier coefficient.

By changing the bias current's drive frequency in integral steps, as many Fourier coefficients as desired can be directly measured. Under these conditions, Equation (3) becomes $$a_n = \frac{1}{L}\int_0^L H_t(x)\sin(nx)dx \qquad (4)$$

where $a_n$ is the nth harmonic Fourier coefficient. Therefore, a set of spatial Fourier coefficients can be measured directly.

Equation (4) pertains to inventive embodiments wherein a sine wave bias field is applied to the length L of the sensing element. Nevertheless, it should be readily apparent to the ordinarily skilled artisan who reads this disclosure that Fourier analysis can be performed for inventive embodiments regardless of the nature of the harmonic wave. Whether the imparted wave bias is sinusoidal or cosinusoidal, the nth harmonic Fourier coefficient $a_n$ can be inventively solved for in analogous fashion. Hence, when a cosine wave bias field is applied to the length L of the sensing element, the nth harmonic Fourier coefficient $a_n$ is given by $$a_n = \frac{1}{L}\int_0^L H_t(x)\cos(nx)dx \qquad (5)$$

In some inventive applications, the spatial Fourier coefficients may represent the only desired parameter from the inventive standing wave magnetometer. In other inventive applications, the actual spatial distribution of magnetic field can be regenerated mathematically by computing the inverse Fourier sine series/transform (or the inverse Fourier cosine series/transform, as the case may be) using the measured Fourier coefficients as input. As a result, the spatial distribution of magnetic field can be inventively measured with very high fidelity without requiring a large number of individual sensing elements and their associated electronics. In addition, only one data acquisition channel is required for the inventive standing wave magnetometer, while many data acquisition channels would be required for an array of conventional sensors (one data acquisition channel for each conventional sensor).

As previously mentioned herein, various winding conduction configurations other than those represented herein in FIG. 1 and FIG. 2 can be effectuated for producing the standing wave bias field. In fact, various non-solenoid methodologies of generating a standing wave bias field (i.e., methodologies which do not involve winding of one or more conducting members) can be practiced in association with the inventive standing wave magnetometer.

Referring to FIG. 3 and FIG. 4, two different types of non-solenoid conducting means are shown to be inventively implemented. Coaxial cable means is shown in FIG. 3 to be disposed inside (through) the sensing element, in order to produce the standing wave bias field. Waveguide cavity means is shown in FIG. 4 to be disposed outside (around) the sensing element, in order to produce the standing wave bias field.

As shown in FIG. 3, coaxial cable 23 is longitudinally (e.g., axially) disposed within integrating sensing element 20. Coaxial cable 23 has inner conductor 24, inner insulation 25, outer conductor 26 and outer insulation 27. The principle of operation is similar to that shown in FIG. 1. Conductors 24 and 26 are driven with radio frequency (RF) current source 19, thereby producing a standing wave bias field along the length of integrating sensing element 20. Leads/ends 29 and 31 of conductors 24 and 26, respectively, are connected to radio frequency current source 19. Opposite ends 28 and 30 of conductors 24 and 26, respectively, are not connected. Accordingly, an impedance discontinuity is formed in such a way as to reflect the RF signal and form the standing wave with a sinusoidal pattern.

As shown in FIG. 4, waveguide 32 is a sort of conduit which permits energy flow therethrough; in principle, the enveloped insulating medium conducts the energy, while the enveloping conductor guides the flow of energy. Waveguide 32 includes a conductive (e.g., metallic) tube 33 and a resonant cavity 34. Cavity 34 is a space which is enclosed by conductive tube 33 and which permits internal resonant oscillation of electromagnetic waves of specific frequencies (e.g., radio frequencies). Integrating sensing element 20 is surrounded by cavity 34. Tube 33 confines and guides the propagation of electromagnetic (e.g., radio frequency) waves in the lengthwise, axial direction of tube 33—that is, in the direction of axis 10 of integrating sensing element 20. Tube 33 and integrating sensing element 20 are approximately coaxial; in other words, they share axis 10.

Still referring to FIG. 4, lead 35 connects tube 33 with RF current source 19. In order to produce the required standing wave, radio frequency field excitation probe 36 is placed inside cavity 34 and is driven with RF current source 19. Cavity 34 thus acts as a resonator which is excited by RF field excitation probe 36 so as to become a source of electromagnetic RF oscillations. Electrically, the energy is carried by the standing wave which is reflected from the inside surface(s) of tube 33, resulting in guided transmission along tube 33.

In the light of this disclosure, the ordinarily skilled artisan appreciates that there are many diverse bias methods and techniques which could be used in inventive practice. Generally, the various bias generation approaches suitable for practicing this invention each implement conductor means which includes either a single conductor or a plurality of conductors.

Moreover, in the light of this disclosure, the ordinarily skilled artisan understands that there is a diversity of sensing elements which could be inventively implemented. The various types of extended integrating magnetic field sensing designs which can be utilized in inventive practice include, but are not limited to, the following: fiber optic; fluxgate magnetometers; magnetoresistive. Conventional fiber optic sensors are inherently integrative. Conventional fluxgate magnetometers and conventional magneto-resistive sensors can be arrayed to achieve an integrative effect in association with inventive practice.

A fiber optic magnetometer is an interferometer with one of the fibers coated with or attached to a magnetostrictive material. Typically, it employs two glass fibers that are arranged to form a Mach-Zender interferometer. Light from a laser passes through a beam splitter into the two fibers, travels along the length of the fibers, is recombined in a beam combiner, and arrives at a photodetector at the end of each fiber. One of the fibers is either wrapped around or coated with a magnetorestrictive material, whose dimensions depend on the direct and extent of its magnetization. When the magnetostrictive material is magnetized by an external field, the length of the fiber changes. If the length changes by a fraction of a wavelength, the light traveling through the fiber arrives at the beam combiner slightly out of phase with the light ariving from the reference fiber. The interference of the two light waves causes the light level at the photodetectors to change by an amount dependent on the phase difference.

Reference is again made to FIG. 1, wherein is shown an example of inventively using a fiber optic sensor (magnetometer) in practicing an inventive standing wave magnetometer. An optical fiber 41 forms one leg of an interferometer, the electron ic components of which are contained in fiber optic sensor electronics unit 42. Only that portion of optical fiber 41 which is contained inside bias solenoids 11 and 13 is coated with the magnetostrictive material. Driving bias solenoids 11 and 13 with a radio frequency (RF) current source 19 will cause a standing wave to be established along the length L of integrating sensing element 20. The wavelength of the standing wave depends on the frequency of RF current source 19 and the characteristics of the respective materials inside bias solenoids 11 and 13. Fiber optic sensor unit 42 communicates with data acquisition/processing means 43.

Hereby incorporated herein by reference is the following U.S. Navy report, which is contained in the aforementioned provisional application being filed concurrently herewith entitled "Integrating Fluxgate Magnetometer and Spatially Integrating Magnetometer": Scarzello, John F. and Edward C. O'Keefe, "Development of Shipboard Magnetic Sensors for Degaussing System Controllers," NSWCCD-TR-98/011, Jun. 30, 1998, Machinery Research and Development Directorate Research and Development Report, Naval Surface Warfare Center, Carderock Division, West Bethesda, Md. 20817-5700 ("Distribution limited to U.S. Government agencies and their contractors; test and evaluation (Jun. 30, 1998). Other requests for this document shall be referred to Carderock Division, Naval Surface Warfare Center (Code 854), West Bethesda, Md. 20817-5700.").

This report entitled "Development of Shipboard Magnetic Sensors for Degaussing System Controllers" is part of a U.S. Navy effort to develop field measurement capability for advanced degaussing (DG) system and closed loop degaussing system (CLDG) controllers, with a view toward reducing vulnerability of surface ships and submarines to magnetic influence sea mines. This report describes, inter alia, two unique integrative sensor methodologies, each of which is inventive in its own right, viz.: an "Integrating Fluxgate Magnetometer" (IFM); and, a "Spatially Integrating Magnetometer" (SIM).

An IFM: (i) measures magnetic fields over the length of its elongated transducer element (e.g., 30 cm), and (ii) spatially integrates the component field amplitudes. An SIM: (i) measures magnetic field amplitude components over a very long linear region, at discrete points, and (ii) integrates these component field values (the sum of the filed component amplitudes) over the length of the transducer element. Either of these novel magnetic sensor systems (i.e., an IFM or an SIM) can be efficaciously (and perhaps preferably) utilized in practicing many embodiments of the present invention. In inventive practice, an SIM can be configured for point measurement or for spatially integrating measurement.

For instance, according to some inventive embodiments, an SIM fluxgate sensor can be designed to be the inner conductor of a coaxial cable RF transmission line. A pertinent principle of the inventive standing wave magnetometer would be that, in an RF transmission line, there are magnetic and electric components to a propagating wave; that is, there are maximum and minimum magnetic field components related to the frequency (wavelength) of the standing wave. In inventive fashion, the positions of the maximum and minimum magnetic field amplitudes can be varied so that field measurements can be computed at each point along the cable by varying the frequency in the coaxial transmission line.

According to some inventive embodiments, an SIM configuration can include plural fiber-optic magnetic field sensors using magnetorestrictive materials in a standing wave RF transmission line. Or, some embodiments can include a Faraday rotation detector using a fiber-optic material with a very high Verdet effect; the Faraday fiber-optic wave guide would be part of an RF transmission line.

Other embodiments of this invention will be apparent to those skilled in the art from a consideration of this specification or practice of the invention disclosed herein. Various omissions, modifications and changes to the principles described may be made by one skilled in the art without departing from the true scope and spirit of the invention which is indicated by the following claims.

What is claimed is:

1. A system for determining the distribution of a magnetic field of interest, said system comprising:
a sensor which is characterized by a sensor length, said sensor being capable of measuring a magnetic field amplitude value over said sensor length, said magnetic field amplitude value being equivalent to an integral of the overall magnetic field which said sensor senses over said length;
means for generating alternating current at at least two frequencies; and
means for conducting said generated alternating current so as to establish, in association with each of said at least two frequencies, a standing wave magnetic field along said sensor length, each said established standing wave magnetic field being characterized by a corresponding spatial distribution representing a different whole number of harmonic cycles in relation to said sensor length;
wherein, in association with each of said at least two frequencies, said measured magnetic field amplitude corresponding to said overall magnetic field which said sensor senses represents a product combination of said magnetic field of interest and the corresponding said established standing wave magnetic field, said sensor thereby measuring a spatial Fourier coefficient corresponding to a component of said magnetic field of interest, said component corresponding to said spatial distribution characterizing the corresponding said established standing wave magnetic field; and
wherein at least two said measured spatial Fourier coefficients are usable for evaluating a Fourier series, said evaluating a Fourier series thereby being based on at least two said components of said magnetic field of interest so that values may be computed which are indicative of said distribution of said magnetic field of interest coefficient.

2. A system for determining the distribution of a magnetic field as in claim 1, wherein each said spatial distribution describes a harmonic pattern selected from the group consisting of sinusoidal and cosinusoidal.

3. A system for determining the distribution of a magnetic field as in claim 1, wherein said means for conducting includes at least one solenoid wound about said sensor.

4. A system for determining the distribution of a magnetic field as in claim 3, wherein said at least one solenoid includes a first solenoid and a second solenoid, said first solenoid and said second solenoid being wound oppositely and approximately equally, said first solenoid having a first open end and a first connected end, said second solenoid having a second open end and a second connected end, said first connected end and said second connected end each being connected to said means for generating alternating current.

5. A system for determining the distribution of a magnetic field as in claim 3, wherein said at least one solenoid includes a solenoid having two ends, each said end being connected to said means for generating alternating current, said solenoid having at least one discontinuity.

6. A system for determining the distribution of a magnetic field as in claim 1, wherein said means for conducting includes coaxial cable means disposed inside said sensor.

7. A system for determining the distribution of a magnetic field as in claim 1, wherein said means for conducting includes waveguide cavity means disposed outside maid sensor.

8. A system for determining the distribution of a magnetic field as in claim 1, wherein each said spatial distribution describes a sinusoidal pattern, and wherein each said measured spatial Fourier coefficient represents the solution for $a_n$ in the equation $$a_n = \frac{1}{L}\int_0^L H_t(x)\sin(nx)dx,$$

wherein $H_t(x)$ is the magnetic field at a point x of said sensor length, L is said length, and $a_n$ is the nth harmonic said measured spatial Fourier coefficient.

9. A system for determining the distribution of a magnetic field as in claim 1, wherein each said spatial distribution describes a cosinusoidal pattern, and wherein each said measured spatial Fourier coefficient represents a solution for $a_n$ in the equation $$a_n = \frac{1}{L}\int_0^L H_t(x)\cos(nx)dx,$$

wherein $H_t(x)$ is the magnetic field at a point x of said sensor length, L is said length, and $a_n$ is the nth harmonic said measured spatial Fourier coefficient.

10. A system for determining the distribution of a magnetic field as in claim 1, wherein each said spatial distribution represents a waveform selected from the group of waveforms consisting of sine curve and cosine curve.

11. A method for determining the distribution of a magnetic field of interest, said method comprising:
using a sensor for measuring at least two spatial Fourier coefficients, said sensor being characterized by a sensor length, said sensor being capable of measuring a magnetic field amplitude value over said sensor length, said magnetic field amplitude value being equivalent to an integral of the overall magnetic field which said sensor senses over said length;

generating alternating current at at least two frequencies;

conducting said generated alternating current so as to establish, in association with each of said at least two frequencies, a standing wave magnetic field along said sensor length, each said established standing wave magnetic field being characterized by a corresponding spatial distribution representing a different whole number of harmonic cycles in relation to said sensor length; and using said at least two measured spatial Fourier coefficients for evaluating a Fourier series so as to compute values which are indicative of said distribution of said magnetic field of interest;

wherein, in association with each of said at least two frequencies, said measured magnetic field amplitude corresponding to said overall magnetic field which said sensor senses represents a product combination of said magnetic field of interest and the corresponding said established standing wave magnetic field, said sensor thereby measuring said spatial Fourier coefficient corresponding to a component of said magnetic field of interest, said component corresponding to said spatial distribution characterizing the corresponding said established standing wave magnetic field, said evaluating a Fourier series being based on at least two said components of said magnetic field of interest.

12. A method for determining the distribution of a magnetic field as in claim 11, wherein each said spatial distribution describes a harmonic pattern selected from the group consisting of sinusoidal and cosinusoidal.

13. A method for determining the distribution of a magnetic field as in claim 11, wherein said generating alternating current includes effectuating a source of said alternating current, and wherein said conducting includes;

winding at least one solenoid about said sensor; and connecting said at least one solenoid to said source of said alternating current.

14. A method for determining the distribution of a magnetic field as in claim 13, wherein said at least one solenoid includes a first solenoid and a second solenoid, said first solenoid and said second solenoid being wound oppositely and approximately equally, said first solenoid having a first open end and a first connected end, said second solenoid having a second open end and a second connected end, said first connected end and said second connected end each being connected to said source of said alternating current.

15. A method for determining the distribution of a magnetic field as in claim 17, wherein said at least one solenoid includes a solenoid having two ends, each said end being connected to said source of said alternating current, said solenoid having at least one discontinuity.

16. A method for determining the distribution of a magnetic field as in claim 11, wherein said conducting includes disposing coaxial cable means inside said sensor.

17. A method for determining the distribution of a magnetic field as in claim 11, wherein said conducting includes disposing waveguide cavity means outside said sensor.

18. A method for determining the distribution of a magnetic field as in claim 11, wherein each said spatial distribution describes a sinusoidal pattern, and wherein each said measured spatial Fourier coefficient represents the solution for $a_n$ in the equation $$a_n = \frac{1}{L}\int_0^L H_t(x)\sin(nx)dx,$$

wherein $H_t(x)$ is the magnetic field at a point x of said sensor length, L is said length, and $a_n$ is the nth harmonic said measured spatial Fourier coefficient.

19. A method for determining the distribution of a magnetic field as in claim 11, wherein each said spatial distribution describes a cosinusoidal pattern, and wherein each said measured spatial Fourier coefficient represents the solution for $a_n$ in the equation $$a_n = \frac{1}{L}\int_0^L H_t(x)\cos(nx)dx,$$

wherein $H_t(x)$ is the magnetic field at a point x of said sensor length, L is said length, and $a_n$ is the nth harmonic said measured spatial Fourier coefficient.

20. A method for determining at least one spatial Fourier coefficient pertaining to a magnetic field of interest, said method comprising:

using a sensor for measuring at least one spatial Fourier coefficient, said sensor being characterized by a sensor length, said sensor being capable of measuring a magnetic field amplitude value over said sensor length, said magnetic field amplitude value being equivalent to an integral of the overall magnetic field which said sensor senses over said length;

generating alternating current at at least one frequency; and conducting said generated alternating current so as to establish, in association with each said frequency, a standing wave magnetic field along said sensor length, each said established standing wave magnetic field being characterized by a corresponding spatial distribution representing a different whole number of harmonic cycles in relation to said sensor length;

wherein, in association with each said frequency, said measured magnetic field amplitude corresponding to said overall magnetic field which said sensor senses represents a product combination of said magnetic field of interest and the corresponding said established standing wave magnetic field, said sensor thereby measuring said spatial Fourier coefficient corresponding to a component of said magnetic field of interest, said component corresponding to said spatial distribution characterizing the corresponding said established standing wave magnetic field.

21. A method for determining at least one Fourier coefficient as in claim 20, wherein:

each said spatial distribution describes a harmonic pattern selected from the group consisting of sinusoidal and cosinusoidal;

if said harmonic pattern is sinusoidal, each said measured spatial Fourier coefficient represents the solution for $a_n$ in the equation $$a_n = \frac{1}{L}\int_0^L H_t(x)\sin(nx)dx,$$

wherein $H_t(x)$ is the magnetic field at a point x of said sensor length, L is said length, and $a_n$ is the nth harmonic said measured spatial Fourier coefficient; and if said harmonic pattern is cosinusoidal, each said measured spatial Fourier coefficient represents the solution for $a_n$ in the equation $$a_n = \frac{1}{L}\int_0^L H_t(x)\cos(nx)dx,$$

wherein $H_t(x)$ is the magnetic field at a point x of said sensor length, L is said length, and $a_n$ is the nth harmonic said meansured spatial Fourier coefficient.

* * * * *